United States Patent [19]

Bateman

[11] Patent Number: 4,507,615

[45] Date of Patent: Mar. 26, 1985

[54] NON-LINEAR AMPLIFIER SYSTEMS

[75] Inventor: Glenn Bateman, Aloha, Oreg.

[73] Assignee: Tektronix, Inc., Beaverton, Oreg.

[21] Appl. No.: 450,303

[22] Filed: Dec. 16, 1982

[51] Int. Cl.³ .......................... G06G 7/12; G06G 7/20
[52] U.S. Cl. .................................. 328/142; 307/490; 307/492; 328/144
[58] Field of Search .............. 328/142, 143, 144, 145; 307/200 R, 490, 492

[56] References Cited

U.S. PATENT DOCUMENTS 2,692,333 10/1954 Holmes ............................... 328/143
2,817,715 12/1957 Blake .................................. 328/142

Primary Examiner—Stanley D. Miller
Assistant Examiner—Richard Roseen
Attorney, Agent, or Firm—John Smith-Hill

[57] ABSTRACT

A non-linear amplifier system comprises two amplifier stages, a limiter and correction stage and a combining stage. The first amplifier stage amplifies low input signal levels linearly and higher input signal levels non-linearly. The limiter and correction stage amplifies linearly input signal levels corresponding to low input signal levels of the first amplifier stage. The second amplifier stage amplifies non-linearly input signals corresponding to low input signal levels of the first amplifier stage. The combining stage combines the output voltage signals of the first and second amplifier stages and the limiter and correction stage. For a range of low input signal levels, the output voltage signal of the combining stage is representative of the output voltage signal of the second amplifier stage, for a range of high input signal levels, the output voltage signal of the combining stage is representative of the output voltage signal of the first and second amplifier stages, and for a crossover range of input signal levels, which is intermediate the low range and the high range, the output voltage signal of the combining stage is representative of the output voltage signal of the second amplifier stage.

2 Claims, 3 Drawing Figures

NON-LINEAR AMPLIFIER SYSTEMS

This invention relates to non-linear amplifier systems, i.e., amplifier systems having a non-linear, e.g. logarithmic, transfer function between the input and output signals.

BACKGROUND OF THE INVENTION

Logarithmic amplifiers have been widely used in various equipment and instruments including spectrum analyzers, communication equipment, etc. to provide a wider dynamic range. For example, input signals having a dynamic range of over 70 dB may be amplified.

One conventional approach to logarithmic amplifiers is the use of several cascaded logarithmic amplifier stages, in which each stage becomes a unity gain amplifier sequentially from the output stage as the input signal level increases. Such logarithmic amplifiers are disclosed in U.S. Pat. No. 3,646,456 to Kauffman et al. and Japanese Patent Publications Nos. 35270/77 and 4055/81 all assigned to the assignee hereof. A disadvantage of such logarithmic amplifiers is the high component count, with the attendant high cost, long assembly time and danger of reduced reliability.

SUMMARY OF THE INVENTION

According to the present invention there is provided a non-linear amplifier system comprising a first amplifier stage having an input terminal to which an input current signal may be applied and having an output terminal at which an output voltage signal is developed in response to the input current signal, said first amplifier stage being operative to amplify low input signal levels linearly and higher input signal levels non-linearly; a limiter and correction stage having an input terminal connected to the output terminal of the first amplifier stage and also having a first output terminal at which an output voltage signal is developed in response to the output voltage signal of the first amplifier stage, and a second output terminal at which an output current signal is provided in response to the output voltage signal of the first amplifier stage, said limiter and correction stage being operative to amplify linearly input signal levels corresponding to low input signal levels of the first amplifier stage and to establish maximum permitted values for its output voltage and current signals; a second amplifier stage having an input terminal connected to the second output terminal of the limiter and correction stage and an output terminal at which an output voltage signal is developed in response to the input current signal received at its input terminal, said second amplifier stage being operative to amplify non-linearly input signals corresponding to low input signal levels of the first amplifier stage; and a combining stage for combining the output voltage signals of the first and second amplifier stages and the limiter and correction stage, so as to form the difference between the absolute values of the output voltage signals of the first amplifier stage and the limiter and correction stage and to provide an output voltage signal representative of the sum of the absolute values of the difference voltage and the output voltage signal of the second amplifier stage; whereby, for a range of low input signal levels applied to the first amplifier stage, the output voltage signal of the combining stage is substantially representative of the output voltage signal of the second amplifier stage, for a range of high input signal levels applied to the first amplifier stage, the output voltage signal of the combining stage is substantially representative of the output voltage signal of the first and second amplifier stages, and for a crossover range of input signal levels, applied to the first amplifier stage, which is intermediate the low range and the high range, the output voltage signal of the combining stage is representative of the output voltage signal of the second amplifier stage.

By combining the output of the limiter stage with the outputs of the amplifier stages, a smooth crossover is provided from amplifier stage to amplifier stage, allowing a wide dynamic range per amplifier stage.

A logarithmic amplifier system embodying the invention is simple in its circuit arrangement, because only two cascade connected amplifier stages, an intermediate limiter and correction stage and a combining stage are sufficient to provide a wide dynamic range, e.g. 90 dB, while maintaining an accurate logarithmic transfer function. This provides significant advantages in terms of component count, manufacturing cost and other factors over the above mentioned conventional logarithmic amplifier systems.

BRIEF DESCRIPTION OF THE DRAWINGS

For a better understanding of the invention, and to show how the same way be carried into effect, reference will now be made, by way of example, to the accompanying drawings in which.

DETAILED DESCRIPTION OF THE DRAWINGS

Figure 1:
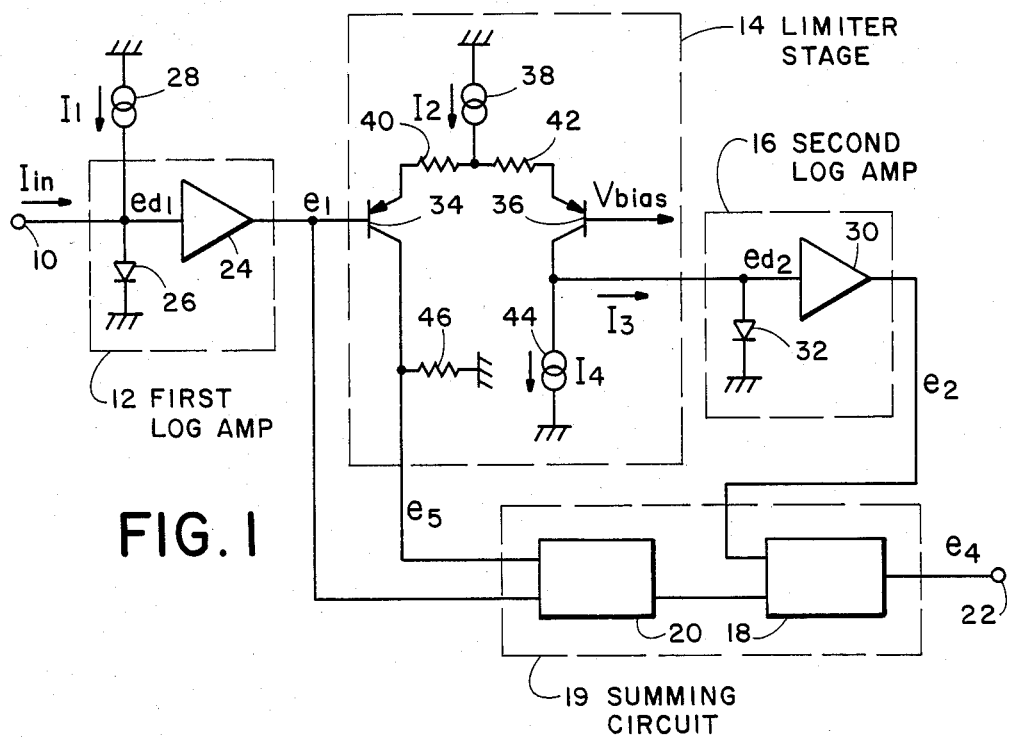
FIG. 1 shows, partially in block form and partially in schematic form, a logarithmic amplifier system embodying the invention.

Referring now to FIG. 1 which shows an electrical circuit of this invention generally in block diagram, the principle of the logarithmic amplifier will be described. It should be noted, however, that this circuit is only to show one preferred embodiment but not to limit this invention.

An input signal current is supplied to input terminal 10 of a first logarithmic amplifier stage 12 including a constant voltage gain (e.g. 7) amplifier 24 and diode 26 such as a Schottky barrier diode connected to the input of amplifier 24 in shunt relation to the input signal. A Schottky barrier diode rather than a conventional pn junction diode is used in this embodiment because its low recovery time renders it well suited for high frequency operations. If the low recovery time were not important, any other conventional diode could be used. As will be fully understood from the description hereinafter, the primary purpose of diode 26 is to develop a voltage $ed_1$ thereacross which is a logarithmic function of the input signal current $I_{in}$. That is, $ed_1 \simeq k \log I_{in}$, where $k$ is a constant. Diode 26 is pre-biased by constant current source 28.

The output from the first logarithmic amplifier stage 12 is then coupled to a second logarithmic amplifier stage 16 by way of an intermediate limiter stage 14. Second logarithmic amplifier stage 16 is essentially similar to the aforementioned first logarithmic amplifier stage and includes shunt diode 32 and constant voltage gain amplifier 30. Limiter stage 14 includes, in this particular embodiment, a pair of transistors 34–36 with the emitters thereof coupled to each other through a pair of series resistors 40-42, and constant current source 38 for supplying a constant current $I_2$ to the junction of resistors 40-42. The output from first logarithmic amplifier stage 12 is coupled directly to the base of transistor 34 while a base bias voltage $V_{bias}$ is applied to the base of transistor 36. The collector of transistor 36 is connected to the input of second logarithmic amplifier stage 16 and also to another current source 44 for sinking a constant current $I_4$.

The outputs from first and second logarithmic amplifier stages 12 and 16 are combined with each other by summing circuit 18 before obtaining the overall output signal at output terminal 22. In order to obtain a smooth transition from one amplifier stage to another, the output voltage developed across collector load resistor 46 of transistor 34 is also combined with the output from first logarithmic amplifier stage 12. Therefore, summing amplifiers 18 and 20 constitute summing means 19 for obtaining the desired logarithmic output signal. Although not shown in FIG. 1, signal delay lines may be used between summing amplifier 20 and first amplifier stage 12 and also limiter 14 in such a manner that all output signals from first amplifier stage 12, limiter stage 14 and second amplifier stage 16 are in correct timing. In other words, such delay lines, which may be coaxial cables of different lengths, compensate for phase differences due to different propagation times in different signal paths. Such compensation is particularly important when amplifying high frequency, high speed signals.

In operation, for small input signal $I_{in}$, e.g. $I_{in} < I_1$ (the current from current source 28), the voltage $ed_1$ across diode 26 varies linearly with $I_{in}$. The fixed offset voltage due to diode 26 and current $I_1$ is inconsequential to the circuit operation. The linearly amplified output voltage $e_1$ from first logarithmic amplifier stage 12 is, then, amplified linearly by limiter stage 14, thereby modulating the collector currents of transistos 34, 36 to split $I_2$ into two parts depending on the base voltages of transistors 34, 36. The input current $I_3$ to diode 32 is given by the following equation:

$$I_3 = I_{36} - I_4$$

where $I_{36}$ is the collector current of transistor 36.

The current $I_3$ develops voltage $ed_2$ across diode 32 before being amplified by amplifier 30. It should be noted that the amplifiers 30 and 24 exhibit a very high input impedance so that all input currents flow into diodes 32 and 26 respectively. The amplifier 30 or 26 may include a MOS field effect transistor (FET) input stage. DMOS or VMOS FETs are particularly suited for this purpose. Voltage signal $ed_2$ is of the same polarity as $e_1$ but a logarithmic function thereof. This means that $ed_2 \simeq k \log I_{in}$. The amplified output voltage $e_2$ is derived from second logarithmic amplifier stage 16 and is summed with the output voltage $e_1$ from first logarithmic amplifier stage 12. The overall output voltage $e_4$ equal to $e_1 + e_2 + e_5$ is available from output terminal 22. It should be noted however that the additional amplification by limiter 14 and amplifier 30 makes $e_1$ negligible compared with $e_2$ in this range of the input signal $I_{in}$. As will be understood from the description hereinafter, the use of relatively low resistance for resistor 46 also makes $e_5$ negligible in this signal level.

As the input signal current increases such that $I_{in} \simeq I_1$, the signal $e_1$ becomes significant compared to $e_2$. However, the correction signal voltage $e_5$ developed across resistor 46 will effectively cancel $e_1$ at this input signal level by proper selection of the gain of transistor 34 substantially determined by the resistance ratio of resistors 40, 42 and 46. It should be noted that $e_5$ is of opposite polarity to $e_1$ so that $e_5$ is substracted from $e_1$ in summing circuit 20. It would be a routine matter to replace summing circuit 20 by a substraction circuit or differential amplifier if $e_1$ and $e_5$ were in phase with each other. It will now be understood that the intermediate stage 14 is not simply a limiter but also a correction circuit to provide a smooth transition from one logarithmic amplifier stage to another.

As the input current $I_{in}$ further increases and approaches ten times $I_1$, transistor 34 in the limiter stage 14 turns off and transistor 36 saturates, thereby clamping the output voltage $e_2$ and correction signal $e_5$ at their maximum limited outputs. The signal level at which the limiter operation begins can be controlled by selection of the current $I_2$ and the resistance values of the resistors 40 and 42. The entire output $e_4$ from the logarithmic amplifier system will be determined by $e_1$ which is now a logarithmic function of the input signal $I_{in}$.

To summarize the logarithmic amplifier system according to the present invention, first and second logarithmic amplifier stages 12 and 16 are cascade connected via an intermediate limiter/correction stage 14 and the output signals from these three stages are summed by summing means 19 to provide a desired logarithmic output. For lower input signal levels, the input signal is linearly amplified by first stage 12 and intermediate stage 14 before reaching the second logarithmic amplifier stage 16 which produces essentially the entire logarithmic output. For medium signal levels, e.g. $I_{in} \simeq I_1$, the first amplifier stage 12 amplifies the input signal both linearly and logarithmically and supplies the amplified signal to the limiter/correction stage 14, which both produces a correction signal of an opposite polarity and proportional to the input signal, and amplifies the input signal and supplies it to amplifier stage 16, which logarithmically amplifies the signal. The output of amplifier stage 12 is summed with the inverted correction signal from limiter/correction stage 14 in summing means 19, which substracts the linear portion of the input signal. This resultant signal is added to the output of amplifier stage 16 to produce the entire logarithmic output. For large signal levels, e.g. $I_{in}$ ten times $I_1$, the amplified output of stage 12 is clamped by the limiter/correction stage 14 at a maximum limited output so as to allow only the linear portion of stage 12 signal to be logarithmically amplified by amplifier stage 16. The logarithmically amplified signal of stage 16 is added in summing means 19 with the resultant sum of the maximum limited correction signal from limiter/correction stage 16 and the signal from first amplifier stage 12 to produce the entire logarithmic output.

It will be understood from the foregoing description, that the intermediate limiter and correction stage plays an important role in achieving a smooth transition or crossover from one amplifier stage 12 to another amplifier stage 16.

Figure 2:
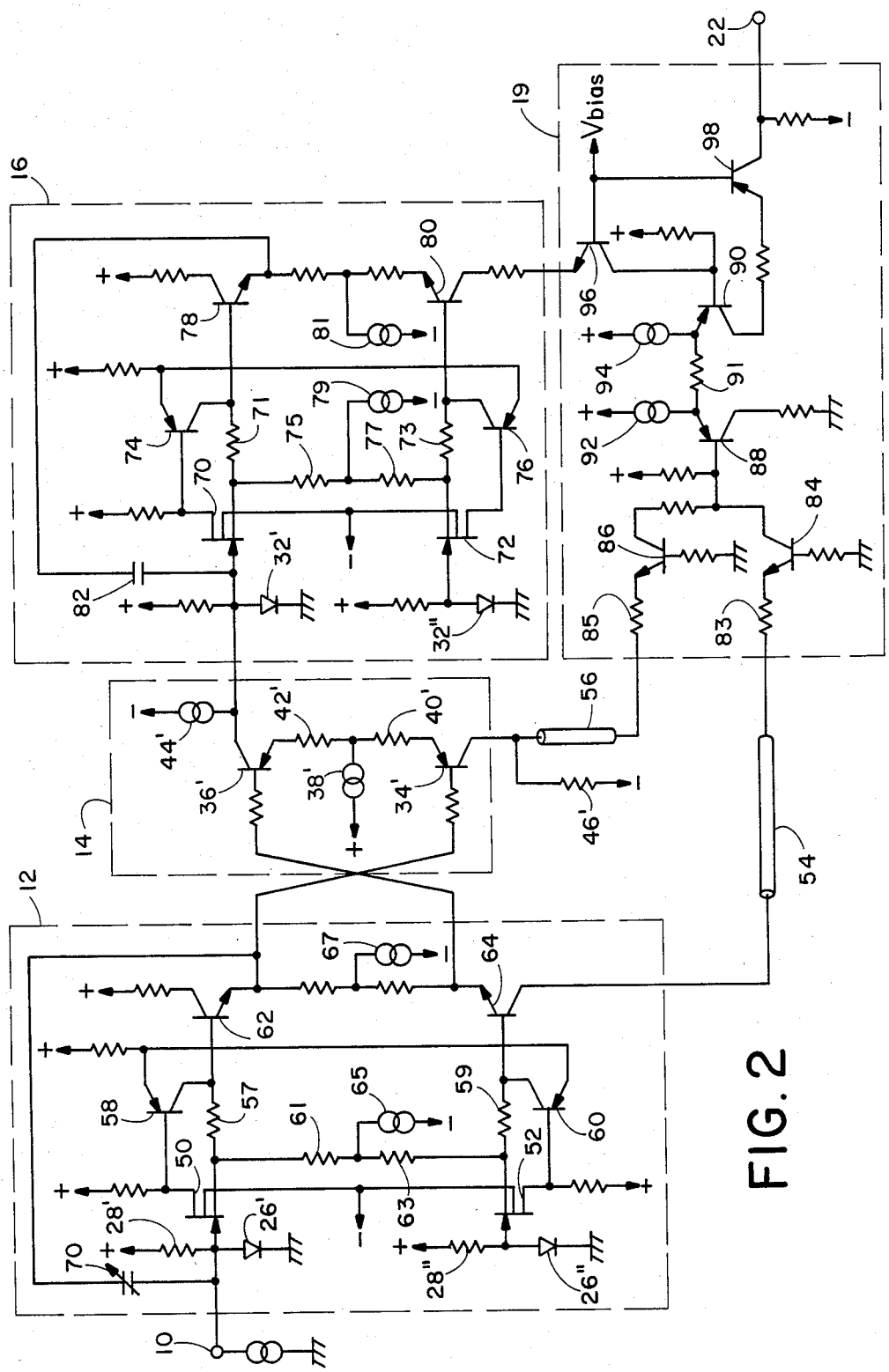
FIG. 2 is a simplified schematic diagram of the amplifier system.

FIG. 2 is a simplified circuit schematic of a practical logarithmic amplifier according to this invention. The circuit arrangement may be modified depending on particular applications.

First amplifier stage 12 is a single source drive differencial amplifier including MOS FETs 50, 52, shunt diodes 26', 26", pnp transistors 58, 60, npn transistors 62, 64, gain setting resistors 57, 59, 61, 63 and feedback capacitor 70, FETs 50, 52, transistors 58, 60, 62, 64 and associated resistors 57, 59, 61, 63 constitute a constant gain feedback amplifier to amplify the voltage developed across diode 26' which may be Schottky barrier diode. Resistor 28' forms a constant current source to prebias diode 26'. Similar diode 26" and bias resistor 28" are connected to the gate of FET 52 for circuit balance. Capacitor 70 provides positive feedback to diode 26' for improving the bandwidth at low input signal levels where the input impedance of amplifier 12 is relatively high. Transistors 58,60 provide high internal gain by direct coupling of the emitters. Transistors 62, 64 are used as a buffer stage, i.e., impedance converter.

Intermediate stage 14 is essentially the same as the one shonw in FIG. 1, and therefore it will not be described further. It may be noted, however, that the intermediate stage may include an additional inverter stage comprising a pair of common emitter transistors to avoid cross connection between the first and intermediate stages.

Second logarithmic amplifier stage 16 has essentially the same circuit arrangement as first amplifier stage 12. That is, second amplifier stage 16 includes MOS FETs 70, 72, two pairs of bipolar transistors 74, 76, 78, 80, voltage gain setting resistors 71, 73, 75, 77, current sources 79, 81 and feedback capacitor 82. The amplifier 16 operates in a similar manner to the first amplifier 12 and provides a logarithmic output of the input signal $I_{in}$ at lower signal levels when limiter stage 14 is operating in a linear fashion.

Summing means 19 includes a pair of common base transistors 84 and 86 respectively connected to the collectors of transistors 64 and 34' through delay lines 54 and 56. Resistors 83 and 85 are used to terminate transmission lines 54 and 56 with their characteristic impedance. The resistance values of such resistors 83, 85 are chosen considering the input impedance of common base transistors 84, 86. The length or delay time of delay lines 54, 56 is chosen so as to match propagation times of three input signals to summing means 19.

The collector outputs of transistors 84, 86 are coupled to the base of transistor 88 which forms a differential amplifier in combination with another transistor 90 as well as emitter coupling resistor 91 and a pair of current sources 92, 94. Coupled to the base of transistor 90 is the collector output of transistor 80 which is the output from second amplifier stage 16. Common base transistor 96 is interposed to reduce Miller capacitance. The collector of transistor 88 is grounded through a resistor while that of transistor 90 is coupled to output terminal 22 by way of common base transistor 98. A common base bias voltage Vbias may be applied to the bases of both transistors 96, 98.

Summing means 19 combines the three output signals with correct time relationship to provide the overall logarithmic transfer function with smooth transition from the first amplifier stage 12 to the second amplifier stage 16.

Figure 3:
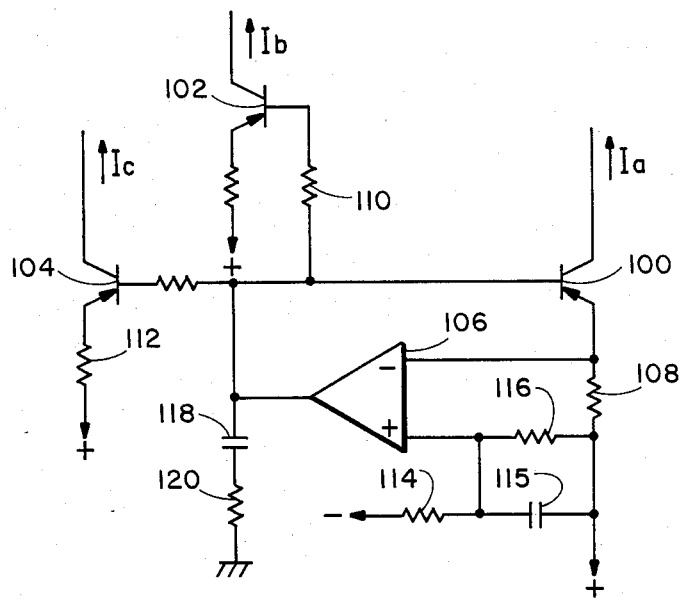
FIG. 3 is a schematic diagram of a current source for use with the amplifier system.

FIG. 3 shows a circuit schematic of a plurality of tracking current sources which may be used for current sources 38, 44. Three tracking currents Ia, Ib, Ic are generated in the shown embodiment. Three transistors 100, 102 and 104 are used with their bases connected together and with the emitters connected to positive voltage source each through programmed resistors 108, 110, and 112. The emitter voltage of the transistor 100 is coupled to the inverting input terminal of a differential operational amplifier 106 to be compared with a reference voltage given by a voltage divider comprising resistors 114, 116 and capacitor 115. The output voltage from amplifier 106 is intergrated by capacitor 118 and resistor 120 before being applied to the bases of transistors 100, 102 and 104.

Now, the high gain of amplifier 106 establishes the base potential of these transistors 100, 102 and 104 so that the emitter current of transistor 100 develops a voltage drop across resistor 108 which is equal to the voltage $V_e$ across resistor 116 and is determined by the resistance ratio of the dividing resistors 114 and 116. The voltage $V_e$ may be, for example, 2 volts. It will now be understood that essentially the same voltage develops across resistors 110 and 112, thereby providing constant currents Ia, Ib and Ic equal to $V_e/R_{108}$, $V_e/R_{110}$ and $V_e/R_{112}$ respectively, where $R_{108}$, $R_{110}$ and $R_{112}$ are the resistance values of resistors 108, 110 and 112. These currents are very stable against temperature variation and vary proportionally if the potential of the voltage source varies for any reasons. This ensures that the limiter operation or transition from one amplifier to another always takes place at a predetermined signal level.

It will be appreciated that the invention is not restricted to the particular amplifier system which has been described and shown, since modifications may be made therein without departing from the scope of the invention as defined in the appended claims, and equivalents thereof. For example, the first and second amplifier stages may take a much simpler circuit configuration for lower frequency applications.

I claim:

1. A non-linear amplifier system comprising:
   a first amplifier stage having an input terminal to which an input current signal may be applied and having an output terminal at which an output voltage signal is developed in response to the input current signal, said first amplifier stage being operative to amplify low input signal levels linearly and higher input signal levels non-linearly;
   a limiter and correction stage having an input terminal connected to the output terminal of the first amplifier stage and also having a first output terminal at which an output voltage signal is developed in response to the output voltage signal of the first amplifier stage, and a second output terminal at which an output current signal is provided in response to the output voltage signal of the first amplifier stage, said limiter and correction stage being operative to amplify linearly input signal levels corresponding to low input signal levels of the first amplifier stage and to establish maximum permitted values for its output voltage and current signals;
   a second amplifier stage having an input terminal connected to the second output terminal of the limiter and correction stage and an output terminal at which an output voltage signal is developed in response to the input current signal received at its input terminal, said second amplifier stage being operative to amplify non-linearly input signals corresponding to low input signal levels of the first amplifier stage; and
   a combining stage connected to the output terminal of the first amplifier stage, the output terminal of the second amplifier stage and the first output terminal of the limiter and correction stage for combining the output voltage signals of the first and second amplifier stages and the limiter and correction stage, so as to form the difference between the absolute values of the output voltage signals of the first amplifier stage and the limiter and correction stage and to provide an output voltage signal representative of the sum of the absolute values of the difference voltage and the output voltage signal of the second amplifier stage;

whereby, for a range of low input signal levels applied to the first amplifier stage, and output voltage signal of the combining stage is representative of the output voltage signal of the second amplifier stage, for a range of high input signal levels applied to the first amplifier stage, the output voltage signal of the combining stage is representative of the output voltage signal of the first and second amplifier stages, and for a crossover range of input signal levels, applied to the first amplifier stage, which is intermediate the low range and the high range, the output voltage signal of the combining stage is representative of the output voltage signal of the second amplifier stage.

2. The amplifier system according to claim 1, wherein each amplifier stage includes a constant voltage gain amplifier having an input terminal, and a non-linear element connected to the input terminal of the constant voltage gain relationship, the non-linear element of the first amplifier stage being pre-biased to provide substantially linear amplification at low input signal levels.

* * * * *